United States Patent
Watanabe et al.

(10) Patent No.: US 9,006,968 B2
(45) Date of Patent: Apr. 14, 2015

(54) MOUNTING SUBSTRATE AND OPTICAL UNIT

(71) Applicant: Sony Corporation, Tokyo (JP)

(72) Inventors: Toshihiko Watanabe, Kanagawa (JP); Yoichi Ohshige, Kanagawa (JP); Masato Doi, Kanagawa (JP); Akiyoshi Aoyagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/933,208

(22) Filed: Jul. 2, 2013

(65) Prior Publication Data

US 2014/0008674 A1    Jan. 9, 2014

(30) Foreign Application Priority Data

Jul. 9, 2012 (JP) .................................. 2012-153765

(51) Int. Cl.
| | | |
|---|---|---|
| H01L 51/50 | (2006.01) | |
| H01L 51/52 | (2006.01) | |
| H01L 23/495 | (2006.01) | |
| H01L 25/075 | (2006.01) | |
| H05K 1/02 | (2006.01) | |
| H01L 33/62 | (2010.01) | |

(52) U.S. Cl.
CPC ...... *H01L 23/49548* (2013.01); *H01L 25/0753* (2013.01); *H01L 33/62* (2013.01); *H01L 2924/0002* (2013.01); *H05K 1/0289* (2013.01); *H05K 2201/10106* (2013.01)

(58) Field of Classification Search
CPC .............. H01L 33/62; H01L 23/49548; H01L 25/0753; H01L 2924/0002
USPC ...................................... 313/498–512
See application file for complete search history.

(56) References Cited

U.S. PATENT DOCUMENTS

| | | | | |
|---|---|---|---|---|
| 6,057,647 | A * | 5/2000 | Kurosawa et al. | 315/169.3 |
| 6,798,132 | B2 * | 9/2004 | Satake | 313/495 |
| 7,417,253 | B2 * | 8/2008 | Yamazaki et al. | 257/72 |
| 7,728,510 | B2 * | 6/2010 | Oh | 313/504 |
| 7,812,523 | B2 * | 10/2010 | Jung et al. | 313/506 |
| 8,022,621 | B2 * | 9/2011 | Park et al. | 313/506 |
| 8,030,838 | B2 * | 10/2011 | Kwak et al. | 313/503 |
| 2004/0075094 | A1 * | 4/2004 | Yamazaki et al. | 257/72 |
| 2005/0077816 | A1 * | 4/2005 | Yamada et al. | 313/503 |
| 2005/0253508 | A1 * | 11/2005 | Okano | 313/506 |
| 2007/0024181 | A1 * | 2/2007 | Oh | 313/500 |
| 2007/0222380 | A1 * | 9/2007 | Yamazaki et al. | 313/509 |
| 2009/0302751 | A1 * | 12/2009 | Hanawa | 313/504 |

(Continued)

FOREIGN PATENT DOCUMENTS

JP    2009-272591 A    11/2009

*Primary Examiner* — Anne Hines
*Assistant Examiner* — Jose M Diaz
(74) *Attorney, Agent, or Firm* — Wolf, Greenfield & Sacks, P.C.

(57) ABSTRACT

A mounting substrate includes: a wiring substrate; and a plurality of optical elements mounted on a mounting surface of the wiring substrate, and each having a first electrode and a second electrode. The wiring substrate includes a support substrate, a plurality of first wires, and a plurality of second wires. The first wires and the second wires are provided within a layer between the support substrate and the mounting surface. The first wires are electrically connected with the first electrodes. The second wires are electrically connected with the second electrodes, and each have cross-sectional area larger than cross-sectional area of each of the first wires.

13 Claims, 12 Drawing Sheets

(56) References Cited

U.S. PATENT DOCUMENTS

| | | | |
|---|---|---|---|
| 2012/0091484 A1* | 4/2012 | Lee et al. ........................ | 257/91 |
| 2012/0146030 A1* | 6/2012 | You et al. ........................ | 257/59 |
| 2013/0092911 A1* | 4/2013 | Yamazaki et al. .............. | 257/40 |

* cited by examiner

MOUNTING SUBSTRATE AND OPTICAL UNIT

BACKGROUND

The present disclosure relates to a mounting substrate on which a plurality of optical elements are arranged, and an optical unit that includes such a mounting substrate thereon.

In recent years, as a lightweight and low-profile display, an LED (Light Emitting Diode) display that utilizes LEDs for display pixels has drawn attention. Such an LED display is characterized by absence of the viewing angle dependence that the contrast or coloring varies depending on a viewing angle, and high response speed at the time of an attempt to change colors (see Japanese Unexamined Patent Application Publication No. 2009-272591).

SUMMARY

For a flat panel display including an LED display, a large-sized and high-definition display screen has been demanded. Particularly, in case of a large-sized display, it is likely that a current loss will occur due to wiring resistances, and thus such a display has been designed to reduce the wiring resistances. For example, it has been generally performed to increase a cross-sectional area of any wiring for providing a drive current to pixels for decreasing wiring resistances. However, such a method has been disadvantageous in that if a cross-sectional area is made too large, an area occupied by wiring becomes large accordingly, which may pose an impediment to achievement of high-definition display.

There is a possibility that a similar disadvantage would arise in not only a large-sized display, but also a medium- or small-sized display. Further, there is also a possibility that a similar disadvantage would arise in not only a device on which LEDs are arranged, but also a device on which any other types of light-emitting elements are arranged. Furthermore, there is also a possibility that such a disadvantage would arise in not only a device on which light-emitting elements are arranged, but also a device on which photodetector elements (for example, PDs (Photo Diodes)) are arranged.

It is desirable to provide a mounting substrate capable of reducing wiring resistances without posing any impediment to achievement of high-density mounting, and an optical unit that includes such a mounting substrate thereon.

According to an embodiment of the present disclosure, there is provided a mounting substrate including: a wiring substrate; and a plurality of optical elements mounted on a mounting surface of the wiring substrate, and each having a first electrode and a second electrode. The wiring substrate includes a support substrate, a plurality of first wires, and a plurality of second wires. The first wires and the second wires are provided within a layer between the support substrate and the mounting surface. The first wires are electrically connected with the first electrodes. The second wires are electrically connected with the second electrodes and are disposed within a layer between the support substrate and a layer that includes the first wires, and each have cross-sectional area larger than cross-sectional area of each of the first wires.

According to an embodiment of the present disclosure, there is provided an optical unit including: a mounting substrate including a wiring substrate and a plurality of optical elements mounted on a mounting surface of the wiring substrate; and a driving section driving the plurality of optical elements. Each of the optical elements has a first electrode and a second electrode. The wiring substrate includes a support substrate, a plurality of first wires, and a plurality of second wires. The first wires and the second wires are provided within a layer between the support substrate and the mounting surface. The first wires are electrically connected with the first electrodes. The second wires are electrically connected with the second electrodes and are disposed within a layer between the support substrate and a layer that includes the first wires, and each have cross-sectional area larger than cross-sectional area of each of the first wires.

In the mounting substrate and the optical unit according to the above-described respective embodiments of the present disclosure, the plurality of first wires and the plurality of second wires are provided within the layer between the support substrate and the mounting surface of the optical elements. Because this ensures that the mounting surface is not occupied by the first wires and the second wires, the first wires and the second wires pose no impediment to high-density mounting of the optical elements. Further, in the above-described embodiments of the present technology, the second wires with larger cross-sectional areas may be arranged within a layer deeper than the layer where the first wires are arranged, in concrete terms, may be within the layer between the support substrate and the layer that includes the first wires. This makes it possible to alleviate any irregularity on the mounting surface that is formed by the second wires, which allows to reduce the possibility that a mounting location of the optical elements may be limited by a location of the second wires. Also, in the above-described embodiments of the present technology, the second wires may have larger cross-sectional areas than the first wires. This makes it possible to reduce wiring resistances of the second wires.

In the mounting substrate and the optical unit according to the above-described respective embodiments of the present disclosure, the plurality of first wires and the plurality of second wires are provided within the layer between the support substrate and the mounting surface of the optical elements (or light-emitting elements), and the second wires with larger cross-sectional areas may be arranged within the layer between the support substrate and the layer that includes the first wires. Therefore, it is possible to reduce wiring resistances without posing any impediment to achievement of high-density mounting.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some embodiments of the present disclosure are described in details with reference to the drawings. It is to be noted that the descriptions are provided in the order given below.
1. First Embodiment (FIGS. 1 to 8)
2. Modification Examples of First Embodiment (FIG. 9 and FIG. 10)
3. Second Embodiment (FIGS. 11 to 13)
4. Modification Example of Second Embodiment

1. First Embodiment

Configuration

Figure 1:
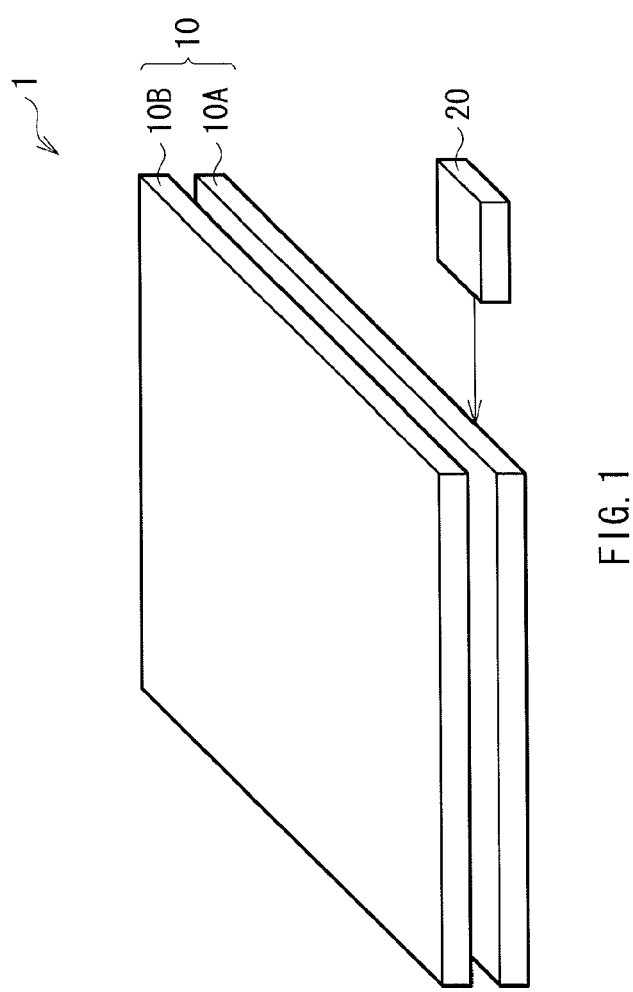
FIG. 1 is a perspective view showing an example of a display unit according to a first embodiment of the present disclosure.

FIG. 1 is a perspective view showing an example of a simplified configuration for a display unit 1 according to one embodiment of the present disclosure. The display unit 1 according to this embodiment of the present disclosure, which may be a so-called LED display, may use LEDs for display pixels. As shown in an example in FIG. 1, the display unit 1 may include a display panel 10, and a driving circuit 20 to drive the display panel 10 (in concrete terms, light-emitting elements 45 to be hereinafter described).
(Display Panel 10)

The display panel 10 is configured in such a manner that a mounting substrate 10A and a counter substrate 10B are overlapped with one another. A front face of the counter substrate 10B is served as an image display surface, which has a display region at a center part thereof, and a frame region that is a nondisplay region at the periphery of the display region.
(Mounting Substrate 10A)

Figure 2:
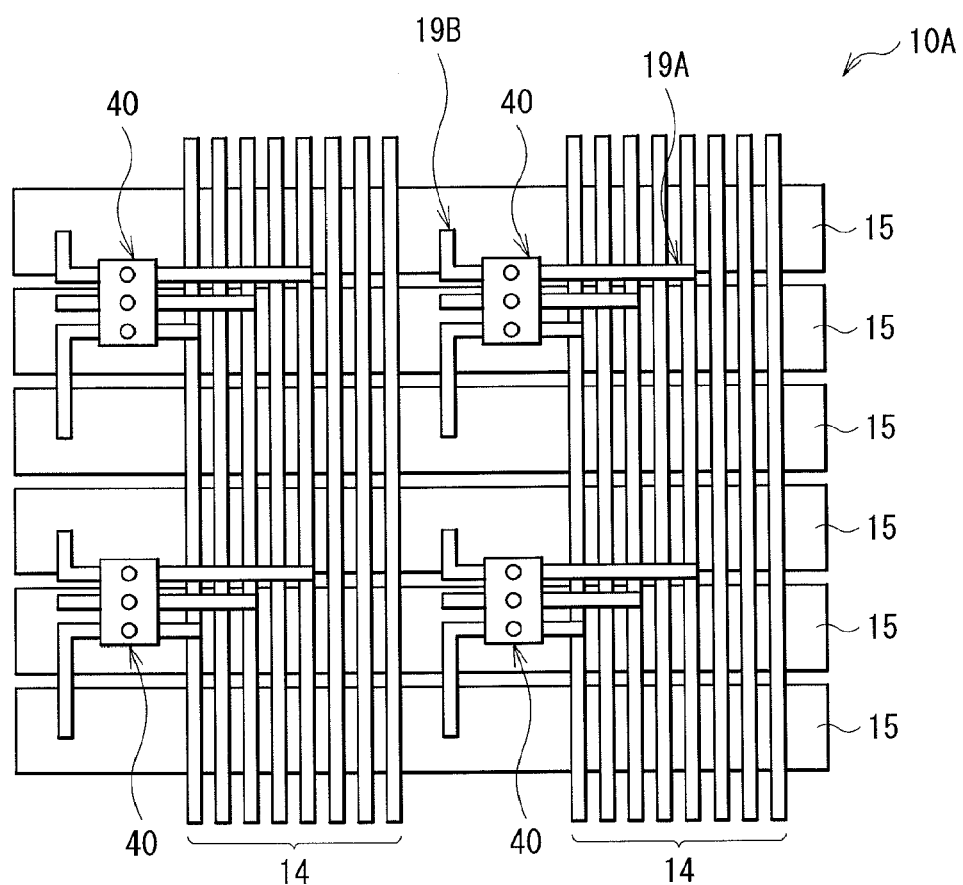
FIG. 2 is a top view showing a layout example for a front face of a mounting substrate illustrated in FIG. 1.

FIG. 2 shows a layout example for a region corresponding to the display region on a front face of the counter substrate 10B side in opposition to the mounting substrate 10A. As shown in an example in FIG. 2, the mounting substrate 10A may have a plurality of Y-wires 14 and a plurality of X-wires 15 equivalent to scan wires at a region corresponding to the display region on a front face of the mounting substrate 10A. The Y-wires 14 and the X-wires 15 are formed at the inside of the mounting substrate 10A, and are not formed on a mounting surface on which light-emitting devices 40 (to be hereinafter described) equivalent to display pixels are mounted.

The Y-wire 14 is a data wire to which a signal depending on an image signal is input by the driving circuit 20. An example of a signal depending on an image signal may include a signal to control ON period (light-emitting period) of the light-emitting device 40 as a small-current signal. Therefore, cross-sectional area of the Y-wire 14 may be small. The plurality of Y-wires 14 are formed to extend in a predetermined direction (column direction in the figure), and are disposed side-by-side at predetermined pitches.

The X-wire 15 is a scan wire to which a signal for selecting the light-emitting device 40 is input by the driving circuit 20. An example of a signal for selecting the light-emitting device 40 may include a signal to provide a drive current to the light-emitting device 40 as a large-current signal. Therefore, the X-wire 15 has cross-sectional area at least larger than that of the Y-wire 14. The X-wire 15 has a flatter and wider cross-sectional shape than the Y-wire 14. In other words, the X-wire 15 has a smaller aspect ratio of cross-sectional area than the Y-wire 14. The plurality of X-wires 15 are formed to extend in a direction intersecting with (for example, may be orthogonal to) the Y-wires 14 (row direction in the figure), and are disposed side-by-side at predetermined pitches. The Y-wire 14 and the X-wire 15 may be configured of, for example, a conductive material such as Cu (copper). The X-wires 15 are arranged within a layer deeper than a layer where the Y-wires 14 are arranged, in concrete terms, within a layer between a later-described support substrate 11 and a layer including the Y-wires 14 (more specifically, within a same layer on which a later-described interlayer insulating film 12 is formed).

The mounting substrate 10A has the plurality of light-emitting devices 40 equivalent to display pixels. The plurality of light-emitting devices 40 may be, for example, disposed side-by-side in a direction parallel to the Y-wires 14 and a direction parallel to the X-wires 15. In other words, the plurality of light-emitting devices 40 may be disposed in a matrix pattern within the display region. Each of the light-emitting devices 40 is electrically connected with the Y-wires 14 via a conductive connecting section 19A, and is electrically connected with the X-wires 15 via a conductive connecting section 19B.

In a typical display unit, display pixels are arranged to avoid any locations right above wires extending in a row direction or wires extending in a column direction. This is because, for example, either wires are formed on the same surface on which display pixels are arranged and thus there is no space for forming the display pixels at the location, or any uneven surface to be formed at a location right above wires is avoided. In this embodiment of the present disclosure, however, the light-emitting devices 40 equivalent to the display pixels are arranged at any location right above the X-wires 15. More specifically, each of the light-emitting devices 40 is disposed at a location straddling the two X-wires 15 that are adjacent to one another. In other words, the plurality of X-wires 15 are disposed side-by-side without avoiding any locations right under the light-emitting devices 40 in a direction intersecting with (for example, may be orthogonal to) the Y-wires 14. It is to be noted that, in this embodiment of the present disclosure, the plurality of Y-wires 14 are arranged side-by-side and disposed to avoid any locations right under the light-emitting devices 40.

Figure 3A:
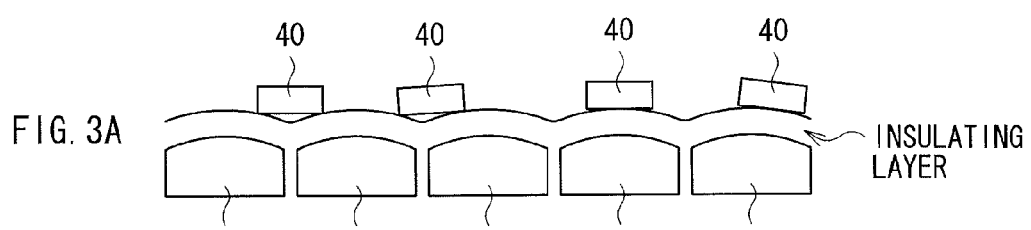
FIGS. 3A and 3B are each a schematic diagram for explaining inclination of a display unit when a mounting surface thereof is uneven.
Figure 3B:
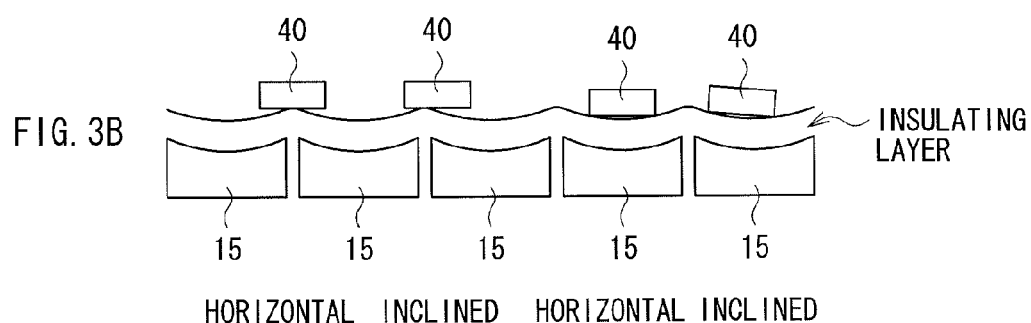

The X-wire 15 takes a flat and wide cross-sectional shape as described above. Consequently, at first view, an extended flat surface seems to be formed at the top surface of the X-wire 15. However, when the X-wire 15 is formed using a pattern plating transfer technique, the top surface of the X-wire 15 may take a convex shape (overhanging shape) or a concave shape (straight shape) in most cases. It is to be noted that a pattern plating technique is a method to obtain a wiring pattern in any shape in such a manner that an insulating layer is patterned in any circuit shape on a conductive base material, and metal such as copper is deposited on the exposed base material using electroplating to be followed by removal of the insulating layer. Therefore, when the X-wire 15 is formed using the pattern plating transfer technique, as shown in FIGS. 3A and 3B for example, if an insulating layer is formed to cover the plurality of X-wires 15 that are disposed side-by-side with each other, an uneven shape is formed correspondingly to a shape of the X-wire 15 on the front face of the insulating layer. Accordingly, to arrange the light-emitting device 40 in a horizontal position (without inclination), it is necessary to arrange the light-emitting device 40 to ensure that a center position of the light-emitting device 40 is located directly above an end side of an array direction (width direction) of the X-wires 15 or directly above a center position of an array direction (width direction) of the X-wires 15.

However, when the top surface of the X-wire 15 is in a convex shape, as shown in FIG. 3A, in the event that a center position of the light-emitting device 40 is misaligned from a location right above an end side of an array direction (width direction) of the X-wires 15 or a location right above a center position of an array direction (width direction) of the X-wires 15 even if only slightly, the light-emitting device 40 is inclined. On the other hand, when the top surface of the X-wire 15 is in a concave shape, as shown in FIG. 3B, in a case where the light-emitting device 40 is arranged directly above an end side of an array direction (width direction) of the X-wires 15, even if a center position of the light-emitting device 40 is misaligned slightly from a location right above an end side of an array direction (width direction) of the X-wires 15, the light-emitting device 40 is kept in a horizontal position. From a viewpoint of ensuring to place the light-emitting device 40 in a horizontal position, therefore, it is preferable that the top surface of the X-wire 15 be in a concave shape, and the light-emitting device 40 be located directly above an end side of an array direction (width direction) of the X-wires 15. In other words, it is preferable that the light-emitting device 40 be arranged at a position where the two X-wires 15 are present directly below the light-emitting device 40.

It is to be noted that when the X-wire 15 is formed using a panel plating technique, a subtractive technique, or the like, the top surface of the X-wire 15 becomes almost flat. In this case, therefore, even if the light-emitting device 40 is arranged at any location in a positional relationship with the X-wire 15, it is possible to assuredly keep the light-emitting device 40 in a horizontal position.

Figure 4:
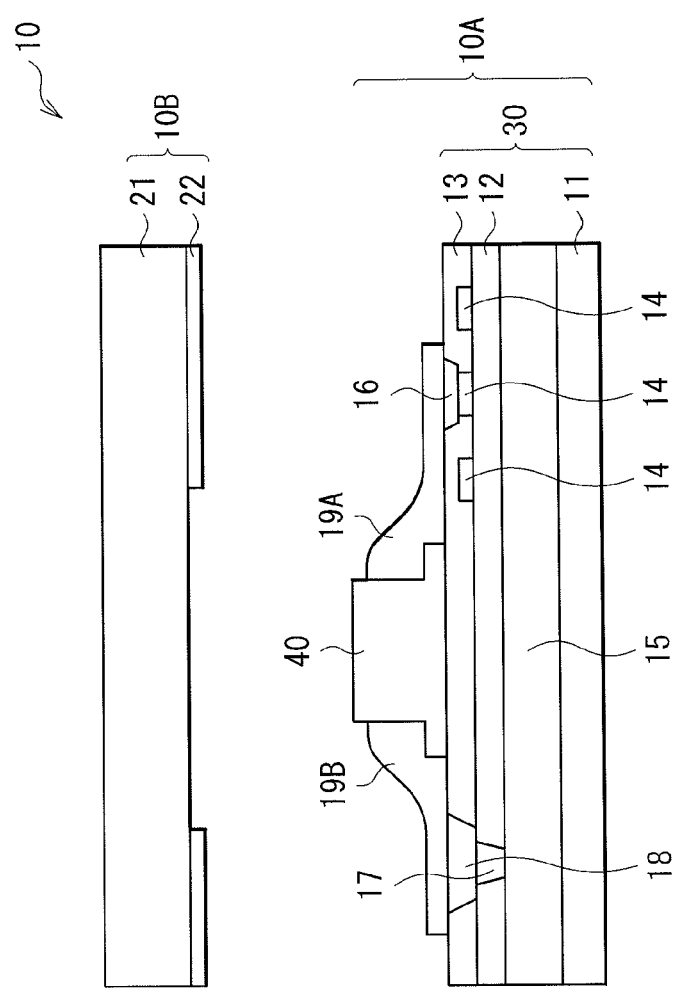
FIG. 4 is a cross-sectional view showing an example for a structure of a cutting surface that is transverse across a light-emitting device in the display unit illustrated in FIG. 1.

As shown in an example in FIG. 4, the mounting substrate 10A has the plurality of light-emitting devices 40 that are mounted on a wiring substrate 30. The wiring substrate 30 may be configured, for example, in a manner of laminating an interlayer insulating film 12 and an interlayer insulating film 13 in this order on a support substrate 11. The support substrate 11 may be configured of, for example, a glass substrate, resin substrate, or the like. Each of the interlayer insulating film 12 and the interlayer insulating film 13 may be configured of, for example, a material such as SiN, $SiO_2$, or $Al_2O_3$. The interlayer insulating film 13 is a layer configuring a topmost front face of the support substrate 11, and the Y-wire 14 may be formed, for example, within the same layer as the interlayer insulating film 13 that is a topmost front face layer. In this case, the Y-wire 14 is electrically connected with a connecting section 19A via a conductive connecting section 16 that is formed within the same layer on which the interlayer insulating film 13 is formed. On the other hand, the X-wire 15 may be formed, for example, within a layer between the support substrate 11 and the interlayer insulating film 13, and may be formed, for example, within the same layer on which the interlayer insulating film 12 is formed. In this case, the X-wire 15 is electrically connected with a connecting section 19B via conductive connecting sections 17 and 18 that are formed within the same layer on which the interlayer insulating films 12 and 13 are formed.

(Counter Substrate 10B)

As shown in an example in FIG. 4, the counter substrate 10B may have a transparent substrate 21, and a black matrix 22 that is formed at the mounting substrate 10A side of the transparent substrate 21. The transparent substrate 21 may be configured of, for example, a glass substrate, transparent resin substrate, or the like.

Figure 5A:
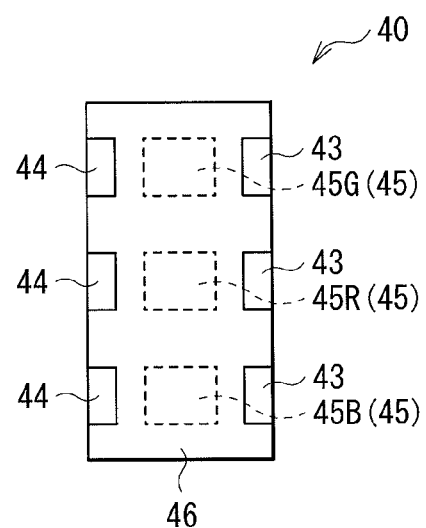
FIGS. 5A and 5B are each a schematic diagram showing an example of a top surface structure and a cross-sectional surface structure of the light-emitting device illustrated in FIG. 4.
Figure 5B:
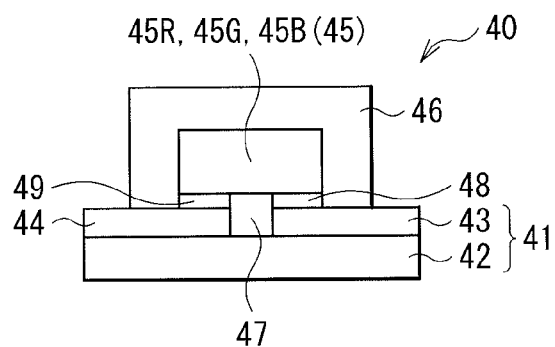

Next, the description is provided on an internal structure of the light-emitting device 40. FIG. 5A shows an example of a top surface structure of the light-emitting device 40. FIG. 5B shows an example of a cross-sectional surface structure cutting across light-emitting elements 45 in the light-emitting device 40 illustrated in FIG. 5A.

The light-emitting device 40 has the light-emitting elements 45 (optical elements) that are mounted on an element substrate 41. The light-emitting element 45 may be, for example, an LED chip. The light-emitting element 45 may have, for example, a semiconductor layer including a laminated structure with an active layer interposed between semiconductor layers of different conductivity types from each other, as well as two electrodes 48 and 49 that are disposed on a common side (same plane) of this semiconductor layer. The electrode 48 is electrically connected with the semiconductor layer of one conductivity type within the semiconductor layer on the light-emitting element 45, while the electrode 49 is electrically connected with the semiconductor layer of the other conductivity type within the semiconductor layer on the light-emitting element 45.

The element substrate 41 may be configured, for example, in a manner of laminating an insulating layer, electrode pads 43 and 44 in this order on a support substrate 42. The support substrate 42 may be configured of, for example, a silicon substrate, resin substrate, or the like. The insulating layer forms a flat surface served as a surface for forming electrode pads 45A and 45B, and may be configured of, for example, a material such as SiN, $SiO_2$, or $Al_2O_3$. The electrode pads 43 and 44, for example, may function as power feeding layers in electrolytic plating, and may also function as electrode pads on which the light-emitting element 45 is mounted. The electrode pads 43 and 44 may be configured of, for example, a material such as aluminum, gold, copper, and nickel.

The light-emitting element 45 is mounted on the electrode pads 43 and 44. In concrete terms, one electrode 43 of the light-emitting element 45 is connected with the electrode 48 via a plated metal (not shown in the figure), while the other electrode 44 of the light-emitting element 45 is connected with the electrode 49 via a plated metal (not shown in the figure). In other words, the electrode 48 is disposed at a position in opposition to at least a part of the electrode pad 43, and is bonded with the electrode pad 43 using a plating treatment. Further, the electrode 49 is disposed at a position in opposition to at least a part of the electrode pad 44, and is bonded with the electrode pad 44 using a plating treatment.

In an example where the light-emitting device 40 has three light-emitting elements 45, one light-emitting element 45 may be, for example, a light-emitting element 45R that emits red-color light, and another light-emitting element 45 may be, for example, a light-emitting element 45G that emits green-color light, and a remaining light-emitting element 45 may be, for example, a light-emitting element 45B that emits blue-color light.

Further, the element substrate 41 also has a resin member 47 within a layer between the light-emitting elements 45 and the support substrate 42. The resin member 47 fixes the light-emitting elements 45 and the support substrate 42 to each other, and may be configured of, for example, a hardened ultraviolet curing resin. In performing electrolytic plating, the resin member 47 is intended to support the light-emitting elements 45 at a location above the support substrate 42 (that is, in midair) to provide a void between the electrodes 48 and 49 and between the electrode pads 43 and 44, respectively.

[Manufacturing Method]

Next, the description is provided on one example for a method of manufacturing the light-emitting device 40. First, a flat surface is formed by covering the support substrate 42 with an insulating film 43, and then the electrode pads 43 and 44 are formed on the flat surface. Subsequently, a photosensitive resin is coated on the whole surface followed by mounting of the light-emitting elements 45 directly above the electrode pads 43 and 44. Thereafter, ultraviolet rays are irradiated from the support substrate 42 while shielding the rays with the electrode pads 43 and 44. As a result, the photosensitive resin becomes hardened, and the resin member 47 is formed at a region between the electrode pads 43 and 44. Afterward, the light-emitting elements 45 are covered with a protective material 46. In such a manner, the light-emitting device 40 may be manufactured.

[Operation and Effects]

Next, the description is provided on an operation and effects of the light-emitting device 40. In this embodiment of the present disclosure, the plurality of Y-wires 14 and the plurality of X-wires 15 are provided within a layer between the support substrate 11 and the mounting surface of the light-emitting elements 45. Because this ensures that the mounting surface is not occupied by the Y-wires 14 and the X-wires 15, the Y-wires 14 and the X-wires 15 pose no impediment to high-density mounting of the light-emitting elements 45. Further, in the present embodiment of the technology, the X-wires 15 with larger cross-sectional areas are arranged within a layer deeper than the layer where the Y-wires 14 with smaller cross-sectional areas are arranged, in concrete terms, within a layer between the support substrate 11 and the layer that includes the Y-wires 14. This makes it possible to alleviate any irregularity on the mounting surface that is formed by the X-wires 15, which allows to reduce the possibility that a mounting location of the light-emitting elements 45 may be limited by a location of the X-wires 15. Also, in the present embodiment of the technology, the X-wires 15 have larger cross-sectional areas than the Y-wires 14. This makes it possible to reduce wiring resistances of the X-wires 15. As a result, this allows to reduce wiring resistances without posing any impediment to achievement of high-density mounting.

2. Modification Examples of First Embodiment

Modification Example 1

Figure 6:
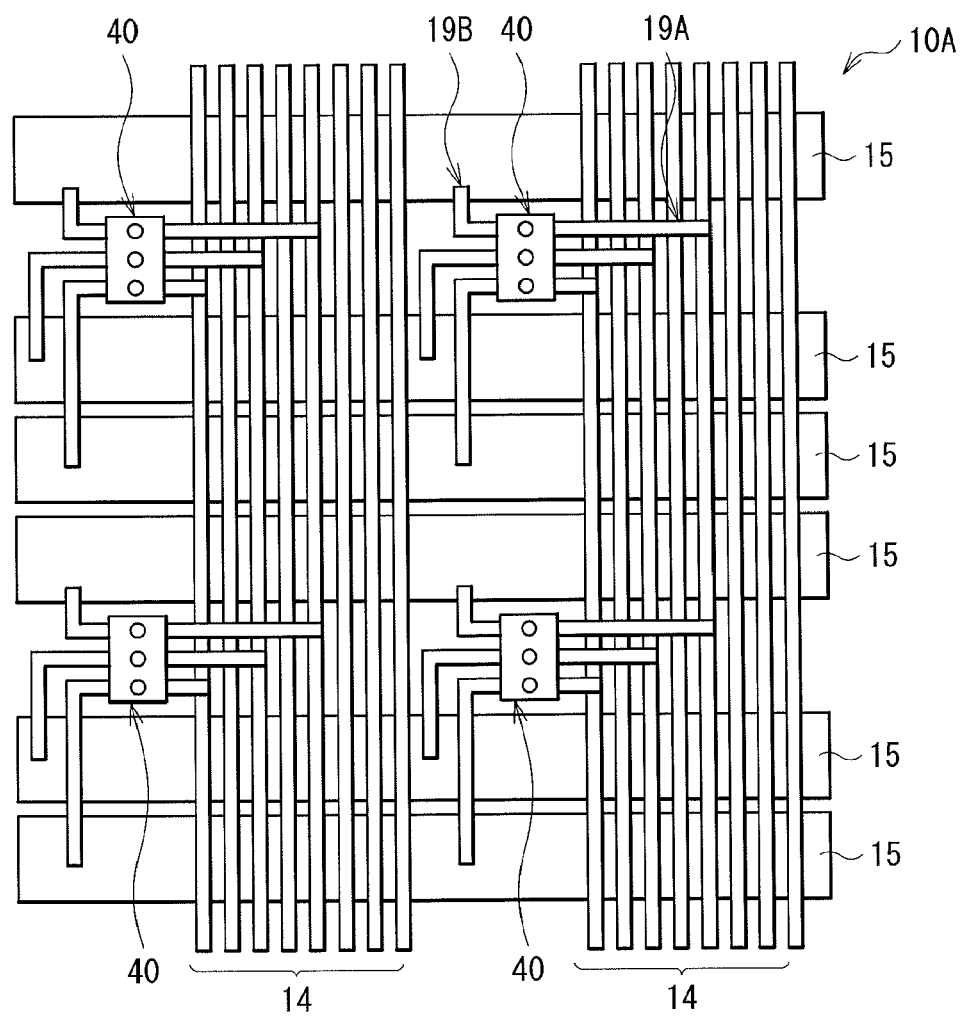
FIG. 6 is a top view showing a first modification example of a front face layout for a mounting substrate illustrated in FIG. 4.

In the above-described embodiment of the present disclosure, the light-emitting device 40 is arranged directly above the X-wire 15, although may be arranged to avoid any location right above the Y-wire 14 and the X-wire 15 as shown in an example in FIG. 6. In other words, the plurality of Y-wires 14 are formed to extend in a predetermined direction (column direction in the figure), and are arranged side-by-side and disposed to avoid any location right beneath the light-emitting device 40 in a direction intersecting with an extending direction of the Y-wires 14. Further, the plurality of X-wires 15 extend in a direction intersecting with the Y-wires 14, and are arranged side-by-side and disposed to avoid any location right beneath the light-emitting device 40 in a direction intersecting with an extending direction of the X-wires 15. In this case, a spacing interval (array pitch of the X-wires 15) between the two X-wires 15 that are adjacent to one another is relatively larger at a position that corresponds to a location right beneath the light-emitting device 40, and is relatively smaller at a position that does not correspond to a location right beneath the light-emitting device 40.

In the present modification example, the light-emitting device 40 may be of a type to output light to the opposite side of the support substrate 11, or on the contrary, may be of a type to output light to the support substrate 11 side. In the latter case, however, the counter substrate 10B is disposed at the support substrate 11 side because of a relationship with the mounting substrate 10A.

Further, in the present modification example, because the X-wire 15 is not provided directly beneath the light-emitting device 40, when a laser is irradiated from the wiring substrate 30 side or the opposite side thereof to connecting sections 19A and 19B for connecting the light-emitting device 40 and the wiring substrate 30 with each other, there is no possibility that the X-wire 15 would be damaged by laser light. Therefore, it is possible to perform a repair, such as replacement of the light-emitting device 40.

Modification Example 2

Figure 7:
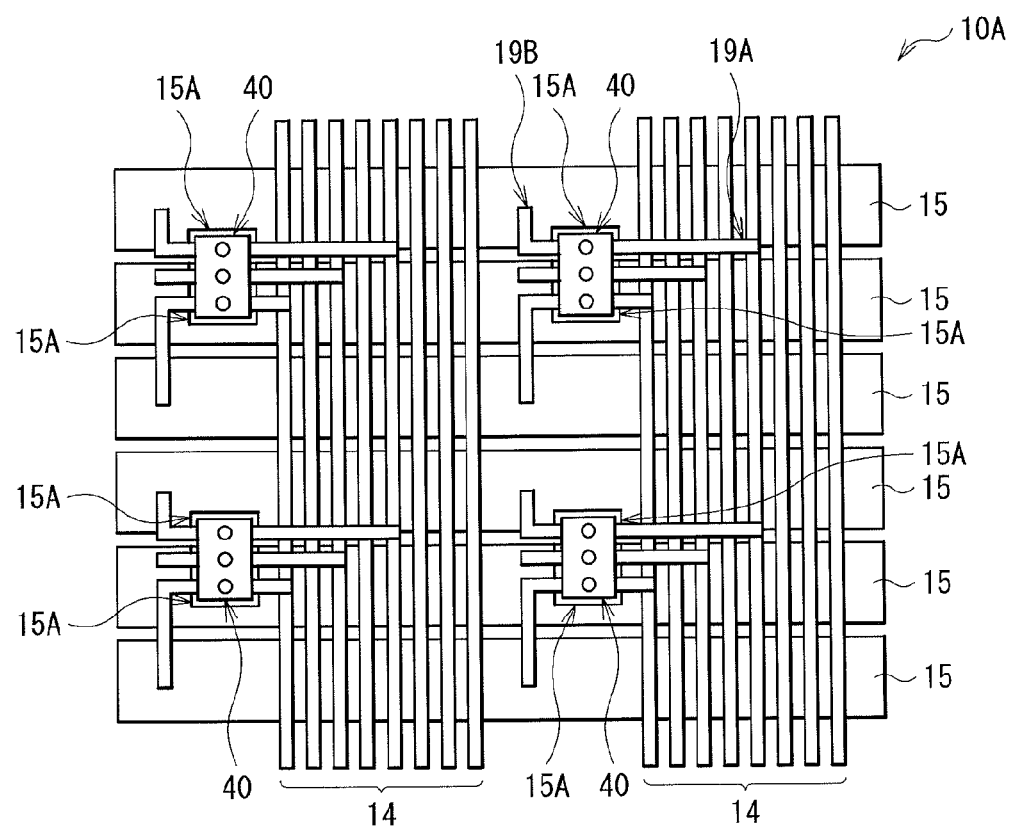
FIG. 7 is a top view showing a second modification example of a front face layout for the mounting substrate illustrated in FIG. 4.

In the above-described embodiment of the present disclosure and the modification example 1, the X-wire 15 takes a rectangular shape, although may have a notch 15A at a position corresponding to a location right beneath the light-emitting device 40 as shown in an example in FIG. 7. In this case, the light-emitting device 40 is disposed at the inside the notch 15A, which makes it possible to keep array pitches of the X-wires 15 at regular spacing intervals.

Further, in the present modification example as well, because the X-wire 15 is not provided directly beneath the light-emitting device 40, when a laser is irradiated from the wiring substrate 30 side or the opposite side thereof to connecting sections 19A and 19B for connecting the light-emitting device 40 and the wiring substrate 30 with each other, there is no possibility that the X-wire 15 would be damaged by laser light. Therefore, it is possible to perform a repair, such as replacement of the light-emitting device 40.

Modification Example 3

Figure 8:
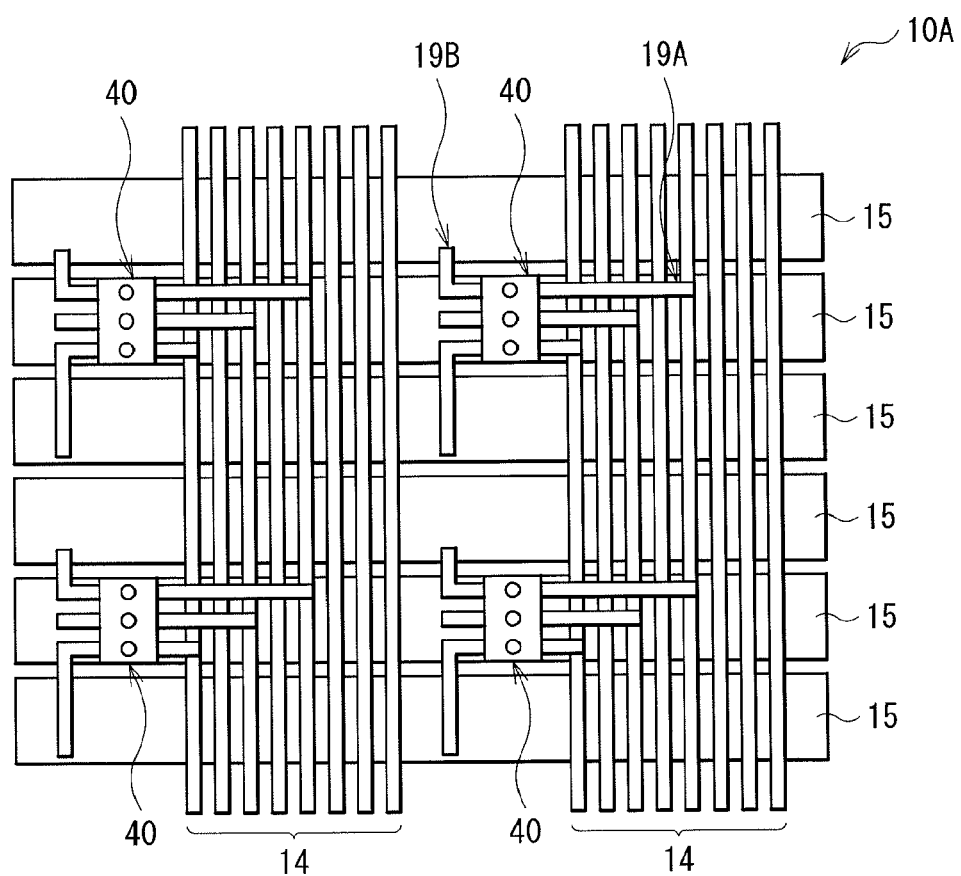
FIG. 8 is a top view showing a third modification example of a front face layout for the mounting substrate illustrated in FIG. 4.

In the above-described embodiment of the present disclosure, as shown in an example in FIG. 8, the light-emitting device 40 may be disposed at a location where only a single X-wire 15 is present directly beneath the light-emitting device 40. At this time, the light-emitting device 40 may be disposed at a location where a center position in a width direction of the X-wire 15 right beneath the light-emitting device 40 and a center position of the light-emitting device 40 are consistent or almost consistent with one another when viewed from a lamination direction.

Modification Example 4

Figure 9:
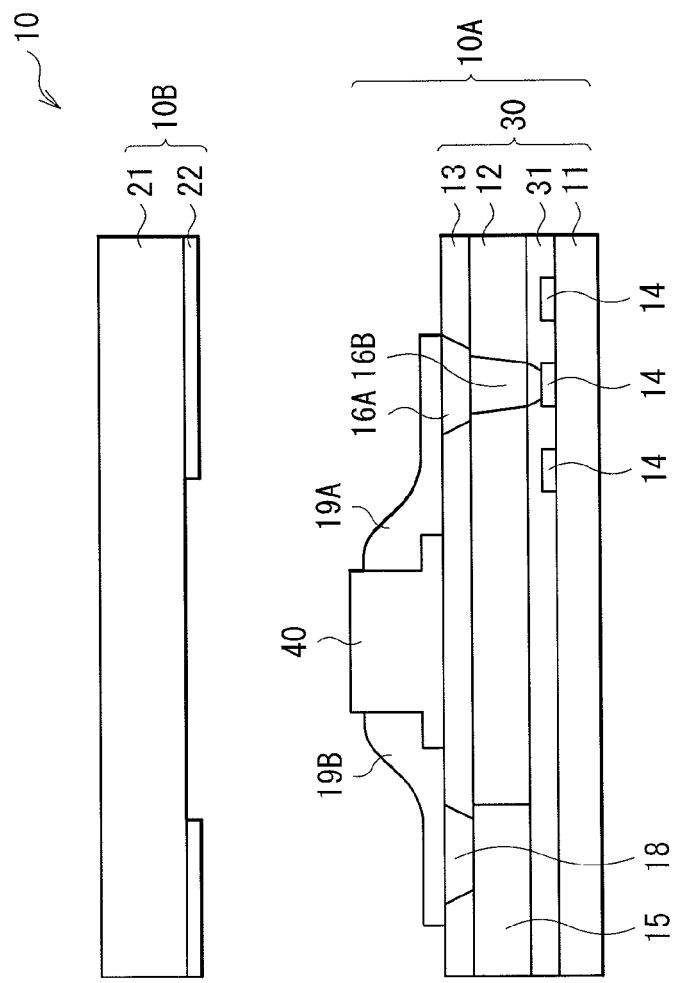
FIG. 9 is a cross-sectional view showing another example for a structure of a cutting surface that is transverse across the light-emitting device in the display unit illustrated in FIG. 1.

In the above-described embodiment of the present disclosure, the X-wires 15 with larger cross-sectional areas are arranged within a layer deeper than a layer where the Y-wires 14 with smaller cross-sectional areas are arranged, although, on the contrary, as shown in an example in FIG. 9, the Y-wires 14 with smaller cross-sectional areas may be arranged within a layer deeper than a layer where the X-wires 15 with larger cross-sectional areas are arranged. At this time, for example, the Y-wires 14 may be disposed within the same layer as an interlayer insulating film 31 that is provided between the support substrate 11 and the interlayer insulating film 12. Further, for example, the Y-wires 14 may be electrically connected with the connecting section 19A via a connecting section 16B that may be provided within the interlayer insulating film 12 and a connecting section 16A that is provided within the interlayer insulating film 13.

Figure 10:
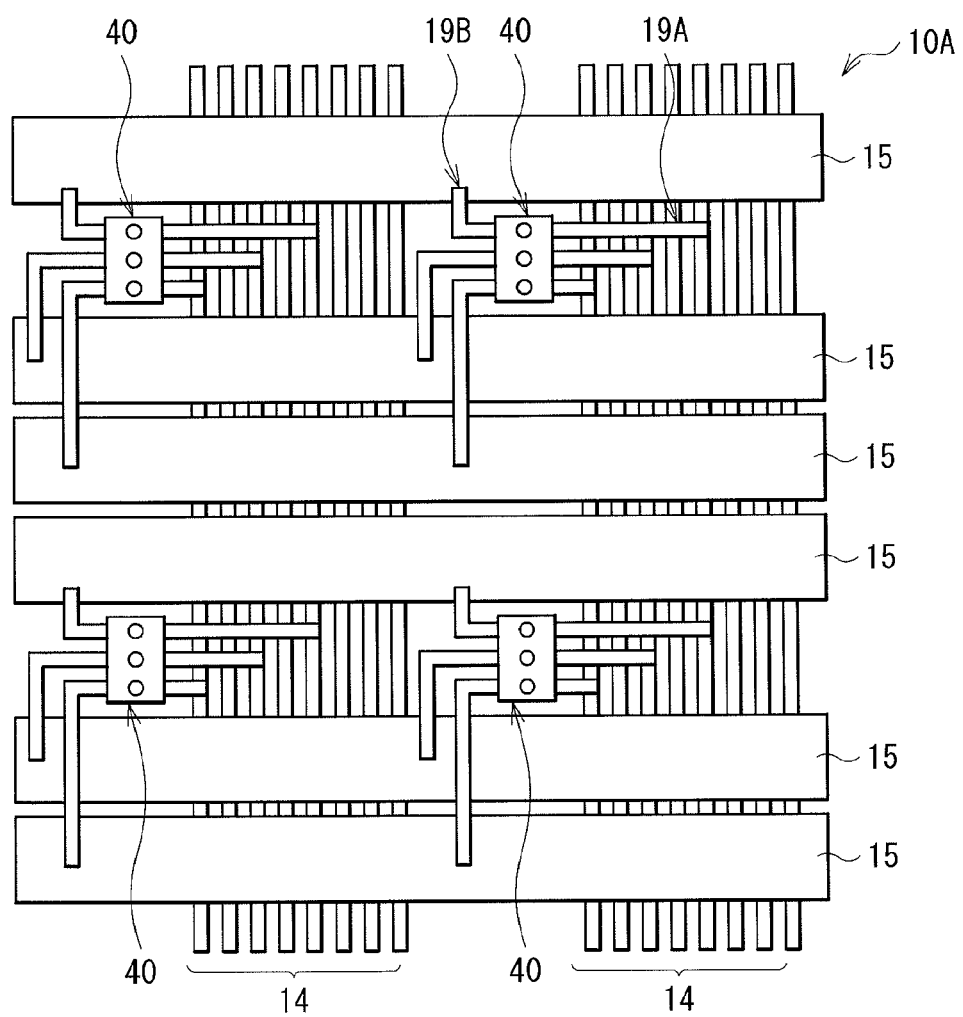
FIG. 10 is a top view showing a layout example for a front face of a mounting substrate illustrated in FIG. 9.

FIG. 10 shows a layout example for a region corresponding to the display region on the front face of the counter substrate 10B side in opposition to the mounting substrate 10A. In the present modification example, the light-emitting device 40 is arranged to avoid any location right above the Y-wire 14 and the X-wire 15. A spacing interval (array pitch of the X-wires 15) between the two X-wires 15 that are adjacent to one another is relatively larger at a position that corresponds to a location right beneath the light-emitting device 40, and is relatively smaller at a position that does not correspond to a location right beneath the light-emitting device 40.

In the present modification example, the light-emitting device 40 may be of a type to output light to the opposite side of the support substrate 11, or on the contrary, may be of a type to output light to the support substrate 11 side. In the latter case, however, the counter substrate 10B is disposed at the support substrate 11 side because of a relationship with the mounting substrate 10A.

Further, in the present modification example, because the X-wire 15 is not provided directly beneath the light-emitting device 40, when a laser is irradiated from the wiring substrate 30 side or the opposite side thereof to connecting sections 19A and 19B for connecting the light-emitting device 40 and the wiring substrate 30 with each other, there is no possibility that the X-wire 15 would be damaged by laser light. Therefore, it is possible to perform a repair, such as replacement of the light-emitting device 40.

Further, in the present modification example, for example, the X-wires 15 may be formed on the top surface of the interlayer insulating film 31 that may be provided within the same layer on which the Y-wires 14 are formed. Because the Y-wires 14 are wires with smaller cross-sectional areas, when the interlayer insulating film 31 is formed in a manner of embedding the Y-wires 14, an uneven surface due to the Y-wires 14 is hardly formed on the top surface of the interlayer insulating film 31. This means that the unevenness of a substrate for forming the X-wires 15 is reduced. This improves the shape accuracy at the time of photolithography to facilitate microscopic wiring formation, ensuring to obtain an effect of easily achieving the high-definition display.

3. Second Embodiment

Figure 11:
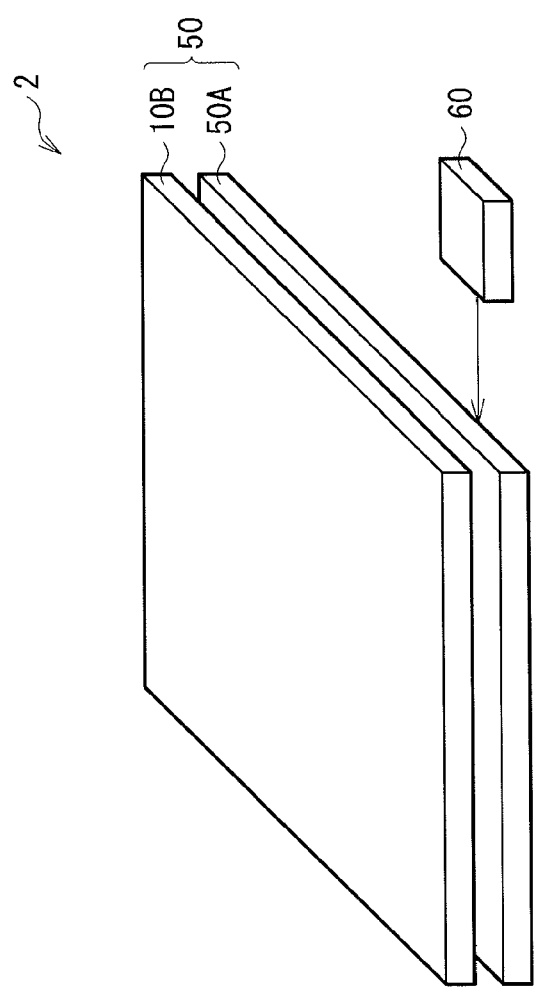
FIG. 11 is a perspective view showing an example of an image pickup unit according to a second embodiment of the present disclosure.
Figure 12:
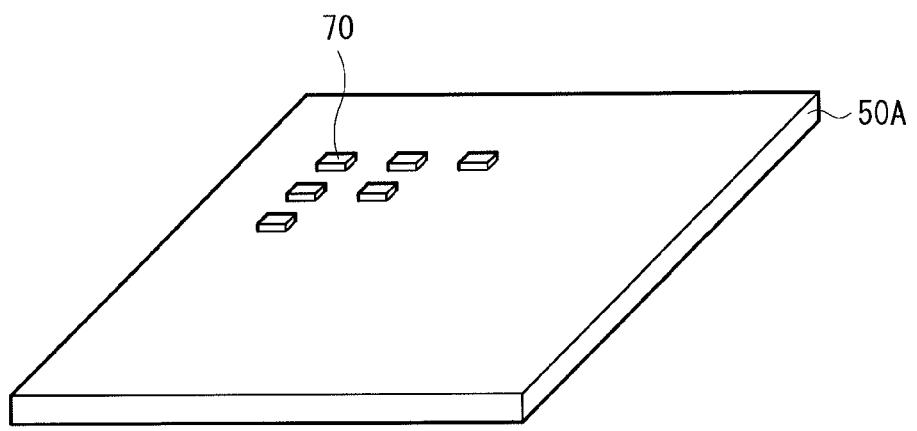
FIG. 12 is a perspective view showing an example of a simplified configuration for a mounting substrate illustrated in FIG. 11.

FIG. 11 is a perspective view showing an example for a simplified configuration of an image pickup unit 2 according to a second embodiment of the present disclosure. The image pickup unit 2 according to the second embodiment of the present disclosure has a plurality of photodetector elements (for example, PDs (Photo Diodes)) that are arranged two-dimensionally. As shown in an example in FIG. 11, the image pickup unit 2 may include an image pickup panel 50, and a driving circuit 60 to drive the image pickup panel 50 (in concrete terms, photodetector elements 71 to be hereinafter described).

Figure 13:
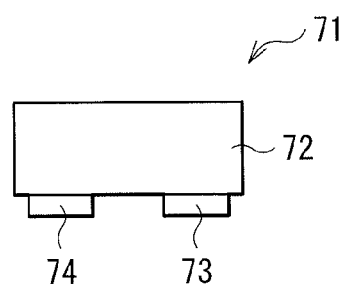
FIG. 13 is a cross-sectional view showing an example for a structure of a photodetector element that is included in a photodetector device illustrated in FIG. 12.

The image pickup panel 50 is configured in such a manner that a mounting substrate 50A and a counter substrate 10B are overlapped with one another. A front face of the counter substrate 10B is served as a light-receiving surface. As shown in an example in FIG. 12, the mounting substrate 50A is equivalent to the mounting substrate 10A on which photodetector devices 70 are provided instead of the light-emitting devices 40. The photodetector device 70 is equivalent to the light-emitting device 40 on which photodetector elements 71 that are illustrated in FIG. 13 are provided instead of the light-emitting elements 45. The photodetector elements 71 include each a semiconductor layer 72 having a photoelectric conversion functionality, as well as two electrodes 73 and 74 that are electrically connected with the semiconductor layer 72. The electrodes 73 and 74 are formed on the same surface on the photodetector element 71, and the electrode 73 is equivalent to the electrode 48, while the electrode 74 is equivalent to the electrode 49 according to the above-described embodiment of the present disclosure, respectively.

In this embodiment of the present disclosure, the plurality of Y-wires 14 and the plurality of X-wires 15 are provided within a layer between the support substrate 42 and the mounting surface of the photodetector elements 71. Because this ensures that the mounting surface is not occupied by the Y-wires 14 and the X-wires 15, the Y-wires 14 and the X-wires 15 pose no impediment to high-density mounting of the photodetector elements 71. Further, in the present embodiment of the technology, the X-wires 15 with larger cross-sectional areas are arranged within a layer deeper than the layer where the Y-wires 14 with smaller cross-sectional areas are arranged, in concrete terms, within a layer between the support substrate 42 and the layer that includes the Y-wires 14. This makes it possible to alleviate any irregularity on the mounting surface that is formed by the X-wires 15, which allows to reduce the possibility that a mounting location of the photodetector elements 71 may be limited by a location of the X-wires 15. Also, in the present embodiment of the technology, the X-wires 15 have larger cross-sectional areas than the Y-wires 14. This makes it possible to reduce wiring resistances of the X-wires 15. As a result, this allows to reduce wiring resistances without posing any impediment to achievement of high-density mounting.

4. Modification Example of Second Embodiment

In the above-described second embodiment of the present disclosure, the X-wires 15 with larger cross-sectional areas are arranged within a layer deeper than a layer where the Y-wires 14 with smaller cross-sectional areas are arranged, although, on the contrary, the Y-wires 14 with smaller cross-sectional areas may be arranged within a layer deeper than a layer where the X-wires 15 with larger cross-sectional areas are arranged. At this time, for example, the Y-wires 14 may be disposed within the same layer as an interlayer insulating film that is provided between the support substrate 42 and the interlayer insulating film 12. Further, for example, the Y-wires 14 may be electrically connected with the connecting section 19A via a connecting section that may be provided within the interlayer insulating films 12 and 13.

In the present modification example, the photodetector device 70 is arranged to avoid any location right above the Y-wire 14 and the X-wire 15. A spacing interval (array pitch of the X-wires 15) between the two X-wires 15 that are adjacent to one another is relatively larger at a position that corresponds to a location right beneath the photodetector device 70, and is relatively smaller at a position that does not correspond to a location right beneath the photodetector device 70.

Further, in the present modification example, because the X-wire 15 is not provided directly beneath the photodetector device 70, when a laser is irradiated from the wiring substrate 30 side or the opposite side thereof to connecting sections 19A and 19B for connecting the photodetector device 70 and the wiring substrate 30 with each other, there is no possibility that the X-wire 15 would be damaged by laser light. Therefore, it is possible to perform a repair, such as replacement of the photodetector device 70.

Further, in the present modification example, for example, the X-wires 15 may be formed on the top surface of an interlayer insulating film that may be provided within the same layer on which the Y-wires 14 are formed. Because the Y-wires 14 are wires with smaller cross-sectional areas, when the interlayer insulating film is formed in a manner of embedding the Y-wires 14, an uneven surface due to the Y-wires 14 is hardly formed on the top surface of the interlayer insulating film. This means that the unevenness of a substrate for forming the X-wires 15 is reduced. This improves the shape accuracy at the time of photolithography to facilitate microscopic wiring formation, ensuring to obtain an effect of easily achieving the high-definition image pickup unit 2.

The present technology is described thus far with reference to some embodiments and modification examples thereof, although the present technology is not limited to the above-described embodiments and the like, but different variations are available.

In the above-described embodiments and the like, for example, the light-emitting device 40 includes the plurality of light-emitting elements 45, although it may include only a single light-emitting element 45. Further, in the above-described embodiments and the like, the plurality of light-emitting devices 40 are mounted on the mounting substrate 10A, although only a single light-emitting device 40 may be mounted alternatively. Additionally, in the above-described embodiments and the like, the plurality of light-emitting devices 40 are mounted in a matrix pattern, although they may be mounted on a line.

In the above-described embodiments and the like, for example, the photodetector device 70 includes the plurality of photodetector elements 71, although it may include only a single photodetector element 71. Further, in the above-described embodiments and the like, the plurality of photodetector devices 70 are mounted on the mounting substrate 10A, although only a single photodetector device 70 may be mounted alternatively. Additionally, in the above-described embodiments and the like, the plurality of photodetector devices 70 are mounted in a matrix pattern, although they may be mounted on a line.

Furthermore, the technology encompasses any possible combination of some or all of the various embodiments described herein and incorporated herein.

It is possible to achieve at least the following configurations from the above-described example embodiments of the disclosure.

(1) A mounting substrate, including:
a wiring substrate; and
a plurality of optical elements mounted on a mounting surface of the wiring substrate, and each having a first electrode and a second electrode, wherein
the wiring substrate includes a support substrate, a plurality of first wires, and a plurality of second wires, the first wires and the second wires being provided within a layer between the support substrate and the mounting surface,
the first wires are electrically connected with the first electrodes, and
the second wires are electrically connected with the second electrodes, and each have cross-sectional area larger than cross-sectional area of each of the first wires.

(2) The mounting substrate according to (1), wherein the second wires are disposed within a layer between the support substrate and a layer that includes the first wires.

(3) The mounting substrate according to (1), wherein the first wires are disposed within a layer between the support substrate and a layer that includes the second wires.

(4) The mounting substrate according to (1) or (2), wherein
the plurality of first wires extend in a first direction and are disposed side-by-side, the first wires being disposed to avoid locations beneath the respective optical elements, and
the plurality of second wires extend in a second direction intersecting with the first direction and are disposed side-by-side in a direction intersecting with the second direction, the second wires being disposed without avoiding the locations beneath the respective optical elements.

(5) The mounting substrate according to (4), wherein any one of the optical elements is disposed at a location where the two second wires are provided directly beneath that optical element.

(6) The mounting substrate according to (4), wherein any one of the optical elements is disposed at a location where only the single second wire is provided directly beneath that optical element.

(7) The mounting substrate according to (6), wherein any one of the optical elements is disposed at a location where, as viewed from a lamination direction, a center position in a width direction of the second wire provided beneath that optical element is consistent or substantially consistent with a center point of that optical element.

(8) The mounting substrate according to any one of (1) to (3), wherein
the plurality of first wires extend in a first direction and are disposed side-by-side in a direction intersecting with the first direction, the first wires being disposed to avoid locations beneath the respective optical elements, and
the plurality of second wires extend in a second direction intersecting with the first direction and are disposed side-by-side in a direction intersecting with the second direction, the second wires being disposed to avoid the locations beneath the respective optical elements.

(9) The mounting substrate according to (8), wherein a spacing interval between the two second wires that are adjacent to one another is relatively larger at a position that corresponds to one of the locations beneath the respective optical elements, and is relatively smaller at a position that does not correspond to one of the locations beneath the respective optical elements.

(10) The mounting substrate according to (8), wherein the plurality of second wires have notches at respective positions that correspond to the locations beneath the respective optical elements.

(11) The mounting substrate according to any one of (1) to (10), wherein each of the optical elements is one of a light-emitting element and a photodetector element.

(12) An optical unit, including:

a mounting substrate including a wiring substrate and a plurality of optical elements mounted on a mounting surface of the wiring substrate; and a driving section driving the plurality of optical elements, each of the optical elements having a first electrode and a second electrode, wherein the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes, and each have cross-sectional area larger than cross-sectional area of each of the first wires.

(13) The optical unit according to (12), wherein the second wires are disposed within a layer between the support substrate and a layer that includes the first wires.

(14) The optical unit according to (12), wherein the first wires are disposed within a layer between the support substrate and a layer that includes the second wires.

The present disclosure contains subject matter related to that disclosed in Japanese Priority Patent Application JP 2012-153765 filed in the Japan Patent Office on Jul. 9, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A mounting substrate, comprising:

a wiring substrate; and a plurality of optical elements mounted on a mounting surface of the wiring substrate, and each having a first electrode and a second electrode, wherein the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes and are disposed within a layer between the support substrate and a layer that includes the first wires, and each have cross-sectional area larger than cross-sectional area of each of the first wires;

wherein:

the plurality of first wires extend in a first direction and are disposed side-by-side, the first wires being disposed to avoid locations beneath the respective optical elements, and the plurality of second wires extend in a second direction intersecting with the first direction and are disposed side-by-side in a direction intersecting with the second direction, the second wires being disposed without avoiding the locations beneath the respective optical elements.

2. The mounting substrate according to claim 1, wherein any one of the optical elements is disposed at a location where the two second wires are provided directly beneath that optical element.

3. The mounting substrate according to claim 1, wherein any one of the optical elements is disposed at a location where only the single second wire is provided directly beneath that optical element.

4. The mounting substrate according to claim 3, wherein any one of the optical elements is disposed at a location where, as viewed from a lamination direction, a center position in a width direction of the second wire provided beneath that optical element is consistent or substantially consistent with a center point of that optical element.

5. A mounting substrate, comprising:

a wiring substrate; and a plurality of optical elements mounted on a mounting surface of the wiring substrate, and each having a first electrode and a second electrode, wherein:

the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes and are disposed within a layer between the support substrate and a layer that includes the first wires, and each have cross-sectional area larger than cross-sectional area of each of the first wires, wherein the plurality of first wires extend in a first direction and are disposed side-by-side in a direction intersecting with the first direction, the first wires being disposed to avoid locations beneath the respective optical elements, and the plurality of second wires extend in a second direction intersecting with the first direction and are disposed side-by-side in a direction intersecting with the second direction, the second wires being disposed to avoid the locations beneath the respective optical elements.

6. The mounting substrate according to claim 5, wherein a spacing interval between the two second wires that are adjacent to one another is relatively larger at a position that corresponds to one of the locations beneath the respective optical elements, and is relatively smaller at a position that does not correspond to one of the locations beneath the respective optical elements.

7. The mounting substrate according to claim 5, wherein the plurality of second wires have notches at respective positions that correspond to the locations beneath the respective optical elements.

8. The mounting substrate according to claim 1, wherein each of the optical elements is one of a light-emitting element and a photodetector element.

9. An optical unit, comprising:

a mounting substrate including a wiring substrate and a plurality of optical elements mounted on a mounting surface of the wiring substrate; and a driving section driving the plurality of optical elements, each of the optical elements having a first electrode and a second electrode, wherein the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes and are disposed within a layer between the support substrate and a layer that includes the first wires, and each have cross-sectional area larger than cross-sectional area of each of the first wires, wherein the plurality of first wires extend in a first direction and are disposed side by side, and the plurality of second wires extend in a second direction intersecting with the first direction and are disposed side by side.

10. A mounting substrate, comprising:

a wiring substrate; and a plurality of optical elements mounted on a mounting surface of the wiring substrate, and each having a first electrode and a second electrode, wherein the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes, and each have cross-sectional area larger than cross-sectional area of each of the first wires, wherein the plurality of first wires extend in a first direction and are disposed side by side, and the plurality of second wires extend in a second direction intersecting with the first direction and are disposed side by side.

11. The mounting substrate according to claim 10, wherein the first wires are disposed within a layer between the support substrate and a layer that includes the second wires.

12. An optical unit, comprising:

a mounting substrate including a wiring substrate and a plurality of optical elements mounted on a mounting surface of the wiring substrate; and a driving section driving the plurality of optical elements, each of the optical elements having a first electrode and a second electrode, wherein the wiring substrate includes a support substrate, a plurality of first wires, and a plurality of second wires, the first wires and the second wires being provided within a layer between the support substrate and the mounting surface, the first wires are electrically connected with the first electrodes, and the second wires are electrically connected with the second electrodes, and each have cross-sectional area larger than cross-sectional area of each of the first wires, wherein the plurality of first wires extend in a first direction and are disposed side by side, and the plurality of second wires extend in a second direction intersecting with the first direction and are disposed side by side.

13. The optical unit according to claim 12, wherein the first wires are disposed within a layer between the support substrate and a layer that includes the second wires.

* * * * *